United States Patent
Brom-Verheyden et al.

(10) Patent No.: US 10,948,444 B2
(45) Date of Patent: Mar. 16, 2021

(54) CONDUCTIVITY SENSOR

(71) Applicant: Stichting IMEC Nederland, Eindhoven (NL)

(72) Inventors: Greja Brom-Verheyden, Riethoven (NL); Marcel Zevenbergen, Helmond (NL); Martijn Goedbloed, Aachen (DE)

(73) Assignee: IMEC VZW, Leuven (BE)

( * ) Notice: Subject to any disclaimer, the term of this patent is extended or adjusted under 35 U.S.C. 154(b) by 5 days.

(21) Appl. No.: 16/219,179

(22) Filed: Dec. 13, 2018

(65) Prior Publication Data

US 2019/0187085 A1 Jun. 20, 2019

(30) Foreign Application Priority Data

Dec. 18, 2017 (EP) .................................... 17207983

(51) Int. Cl.
| | |
|---|---|
| *G01N 27/07* | (2006.01) |
| *G01N 27/414* | (2006.01) |
| *G01N 27/02* | (2006.01) |
| *G01R 27/22* | (2006.01) |

(52) U.S. Cl.
CPC .......... *G01N 27/07* (2013.01); *G01N 27/023* (2013.01); *G01N 27/414* (2013.01); *G01R 27/22* (2013.01)

(58) Field of Classification Search
None
See application file for complete search history.

(56) References Cited

U.S. PATENT DOCUMENTS

| | | | |
|---|---|---|---|
| 3,710,237 A | 1/1973 | Watson et al. | |
| 3,714,555 A | 1/1973 | Greer | |
| 4,767,995 A | 8/1988 | Berry, Jr. et al. | |
| 6,573,734 B2 | 6/2003 | He et al. | |
| 7,032,448 B2* | 4/2006 | Hamamoto | G01N 27/225 361/280 |
| 7,222,531 B2* | 5/2007 | Isogai | G01N 27/223 73/335.02 |
| 7,571,637 B2* | 8/2009 | Chen | G01N 27/223 73/73 |

(Continued)

FOREIGN PATENT DOCUMENTS

| | | |
|---|---|---|
| EP | 1607739 A1 | 12/2005 |
| WO | 2012/148254 A1 | 11/2012 |

OTHER PUBLICATIONS

European Search Report, European Patent Application No. 17207983. 2, dated May 3, 2018, 8 pages.
(Continued)

*Primary Examiner* — Paresh Patel
(74) *Attorney, Agent, or Firm* — McDonnell Boehnen Hulbert & Berghoff LLP

(57) ABSTRACT

The present disclosure relates to a sensor and a measuring system and a sensor network that incorporate one or more such sensors. An example sensor could be configured to measure a conductivity of a liquid. The sensor includes a first electrode and a second electrode, each electrode having a surface area, wherein the surface area of the electrodes determines a cell constant of the sensor (Kcell), and wherein at least one of the electrodes is provided with a switching means arranged so that the surface area of the respective electrode can be changed, thereby varying the cell constant (Kcell) of the sensor.

16 Claims, 15 Drawing Sheets

(56) References Cited

U.S. PATENT DOCUMENTS 8,667,674 B2 * 3/2014 Buysse ............ A61B 18/14
29/846
2006/0198077 A1 9/2006 Bhutta

OTHER PUBLICATIONS

Ibrahim, M. et al., "Geometric Parameters Optimization of Planar Interdigitated Electrodes for Bioimpedance Spectroscopy", Journal of Electrical Bioimpendance, vol. 4, May 1, 2013, p. 13-22.
Yu, Jinsong et al., "Microfabricated Thin Film Impedance Sensor & AC Impedance Measurements", Sensors, vol. 10, Jun. 9, 2010, pp. 5845-5858.
Ma, Hongshen et al., "Calibration-Free Measurement of Liquid Permittivity and Conductivity Using Electrochemical Impedance Test Cell With Servomechanically Adjustable Cell Constant", IEEE Sensors Journal, vol. 9, No. 5, May 2009, pp. 515-524.
Timmer, Bjorn et al., Optimization of an Electrolyte Conductivity Detector for Measuring Low Ion Concentrations, Lab on a Chip, vol. 2, 2002, pp. 121-124.

* cited by examiner

CONDUCTIVITY SENSOR

CROSS-REFERENCE TO RELATED APPLICATIONS

The present application is a non-provisional patent application claiming priority to European Patent Application No. EP 17207983.2, filed on Dec. 18, 2017, the contents of which are hereby incorporated by reference.

FIELD OF THE DISCLOSURE

The present disclosure is related to conductivity sensors and more specifically to integrated conductivity sensors.

BACKGROUND

The conductance (unit: Siemens $1/\Omega$, S) or conductivity (S/m) of an electrolyte is a measure for the total number of dissolved ions. While conductance is a property of the electrolyte including the physical dimensions and electrode layout, the conductivity is the intrinsic property of the electrolyte and therefore a parameter of interest.

Conductance is defined as the inverse of the resistance (1/R). For measuring the conductance, a conductivity sensor with at least two poles with an opposite charge is needed. To determine the conductivity of a solution (k), the cell constant of the sensor (Kcell) is multiplied by the measured conductance (G) or divided by the measured resistance (R) of the fluid.

$$\kappa = Kcell \times G \text{ or } \kappa = \frac{Kcell}{R}$$

κ=conductivity [S cm-1]
G=(measured) conductance [S]
R=(measured) resistance [S2]

The cell constant of the sensor is dependent on the geometry of its two poles. In the case of two flat planar, parallel electrodes, the cell constant is determined by the distance between the electrodes divided by the effective electrolyte area in between them.

$$Kcell = \frac{l}{A}$$

Kcell=Cell constant [cm-1]
l=distance between electrodes [cm]
A=effective area of the electrolyte between the electrodes [cm$^2$]

To measure the electrical resistance of the liquid using conventional measurement equipment, an alternating potential or current is applied to the two electrodes. If a sensor with a high Kcell value is used, the measured resistance is higher than for the same solution measured with a sensor with a low Kcell. If for a highly conductive solution a sensor is used with a low Kcell, the resistance becomes very low. Consequently, the current through the liquid solution and electrodes becomes too high and noise will have a large impact on the measurement and its accuracy. In cases of extremely low conductivity, resistance becomes so high that conductivity is impossible to measure with common readout electronics. Therefore, a conductivity sensor with an appropriate Kcell value fitting with the expected concentration range in the target fluid solution has to be chosen.

Two flat, planar, interdigitated electrodes is a commonly used electrode configuration in miniaturized sensors for the detection of the conductivity in a liquid medium. For example, Timmer et. al. *"Optimization of an electrolyte conductivity detector for measuring low ion concentrations"*, Lab on Chip June 2002, page 121-124 describes such an electrode configuration for use in a lab-on-a-chip and discloses how the Kcell value of such a sensor can be calculated and designed.

A disadvantage of miniaturized conductivity sensors, however, is that their microelectrodes have much higher impedance in comparison to conventional macro-electrodes due to influence of interfacial capacitance. Therefore, miniaturized conductivity sensors are not suitable for measuring as wide a range of conductivities as sensors with macro-electrodes. This implies that a correct miniaturized conductivity sensor (i.e. with the right Kcell value) has to be chosen, fitting with the expected concentration range in the targeted application.

SUMMARY

The present disclosure aims at providing a miniaturized conductivity sensor which can measure a wide range of conductivities while maintaining a compact sensing area.

A sensor for measuring a conductivity of a liquid comprising a first electrode and a second electrode, each electrode having a surface area, wherein the surface area of the electrodes determines a cell constant of the sensor, and wherein at least one of the electrodes is provided with a switching means arranged so that the surface area of the respective electrode can be changed, thereby varying the cell constant of the sensor.

The first and second electrodes act as sensing electrodes. The switching means allow the effective area of a sensing electrode to be varied, thereby allowing the conductivity range (i.e. Kcell) of the sensor to be adjusted for different fluid solutions.

In some embodiments, both the first and second electrodes are provided with switching means. The switching means effectively increase or decrease the surface area of both electrodes to decrease or increase, respectively, the Kcell of the sensor.

A sensor's sensitivity indicates how much the sensor's output changes when the input quantity being measured changes. The sensor sensitivity is defined as the ratio between the output signal and the measured property. For example, for a conductivity sensor with resistance output, the sensitivity of such sensor is a constant (Kcell) with the units cm$^{-1}$.

A sensor's resolution is the smallest change the sensor can detect in the quantity that it is measuring. The resolution of a sensor with a digital output is usually the resolution of the digital output. The resolution is related to the precision with which the measurement is made, however a sensor's accuracy may be considerably worse than its resolution.

In some embodiments, the first electrode and the second electrode form an interdigitated array of electrodes. In such embodiments, the first electrode and the second electrode comprise a plurality of electrode fingers wherein the switching means are arranged so that at least one of the electrode fingers of either one or both electrodes is switchably connectable in parallel to the remaining electrode fingers of the respective electrode. In such embodiments, both electrodes are used for current injection and sensing.

In some embodiments, the first electrode and the second electrode form a meandering array of electrodes. In such embodiments, the first electrode and/or the second electrode comprise a plurality of electrode fingers wherein at least one of the electrode fingers of either one or both electrodes is provided with switching means and arranged so that the at least one electrode finger is switchably connectable in series to the remaining electrode fingers of the respective electrode. In such cases, the effective sensing area of each electrode is adjusted by increasing or decreasing the length of the sensing electrodes.

In some embodiments, the sensor further comprises a third electrode and a fourth electrode, each comprising one or more electrode fingers arranged so that they form an interdigitated array of electrodes, wherein the first and second electrodes are arranged to meander in between the electrode fingers of the third and fourth electrodes. In this embodiment, the first and second electrodes are used for sensing only, while the third and fourth electrodes are used for current injection. Such embodiments offer the additional advantage that only a part of the sensor may be used for measurement. Once damaged this part is easily replaced with another part of the sensor. In further embodiments, the at least one of the electrode fingers of either or both of the third and fourth electrodes are provided with switching means. In addition to the above, such a sensor design provides a more linear Kcell response.

The use of a four-electrode (or four-pole) sensor minimizes the influence of the electrode-electrolyte interface resistance on the measurement resistance. Another advantage of a four-pole measurement system is that there are no electrochemical reactions (e.g. electroplating, corrosion) happening on the measuring electrodes, since there is (almost) no current flowing through these electrodes. Electrochemical reactions could influence the effective area of the sensor and change the Kcell value. In some embodiments of the disclosed four-electrode conductivity sensor, the inner electrodes are folded around the outer electrodes. This has a positive effect in decreasing the sensor area, since the outer electrodes are used on both sides.

In some embodiments, the sensor further comprises a readout circuit arranged for applying alternating potential to the electrodes and for controlling the switching means. Additionally, the readout circuit may further comprise the switching means. In some embodiments, the switching means is provided within the readout circuit, which allows for a conductivity sensor with less parasitics, smaller dimensions, and easily varying the electrode's design (i.e. the number of electrode fingers, the distance between the electrode fingers, etc.) to adjust Kcell.

In some embodiments, the switching means is a transistor. Depending on the technology used for the manufacturing of the sensor, the transistor may be for example CMOS, MEMS, relay, etc.

In some embodiments, the sensor is miniaturized and the electrodes are deposited on an insulating substrate. The substrate may be, for example, silicon (Si) or a glass substrate.

In another aspect, the present disclosure relates to measuring systems comprising one or more sensors for measuring a conductivity of a liquid as detailed above. In such systems, the overall Kcell value is determined by the number of sensors used during the measurements as well as their respective effective sensing area.

In some embodiments, at least one of the conductivity sensors has a same or a different sensor design.

In another aspect, the present disclosure relates to a sensor network comprising a conductivity sensor above and/or a measuring system according to the present disclosure.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The terms first, second, third, and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under, and the like in the description and the claims are used for descriptive purposes and not necessarily for describing relative positions. The terms so used are interchangeable under appropriate circumstances and the embodiments of the disclosure described herein can operate in other orientations than described or illustrated herein.

The term "comprising," used in the claims, should not be interpreted as being restricted to the means listed thereafter; it does not exclude other elements or steps. It needs to be interpreted as specifying the presence of the stated features, integers, steps, or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present disclosure, the only relevant components of the device are A and B.

Figure 1A:
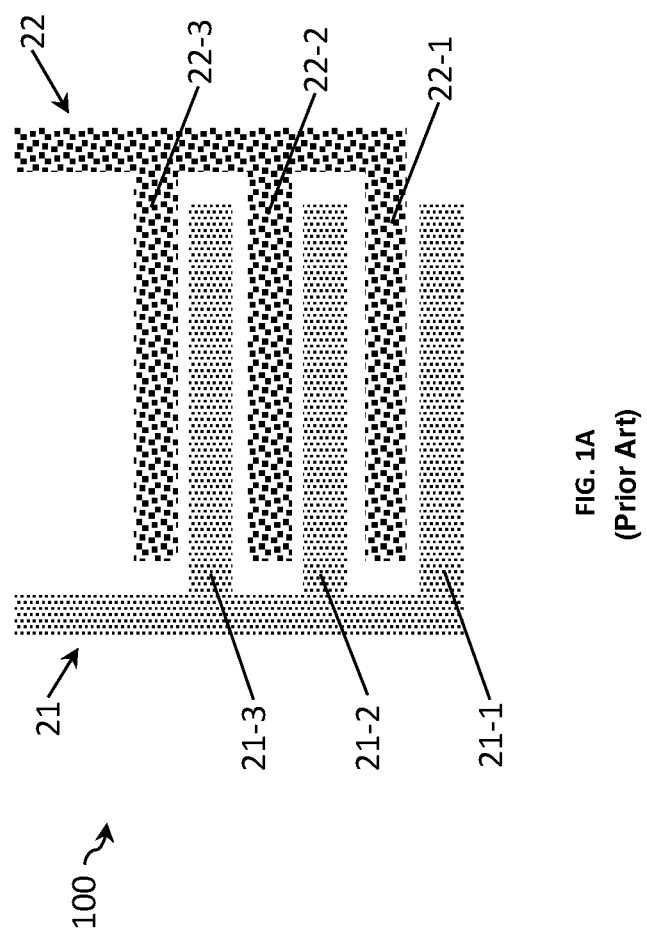
FIGS. 1A and 1B illustrate two exemplary embodiments of a conductivity sensor 100 with a pair of interdigitated planar electrodes.
Figure 1B:
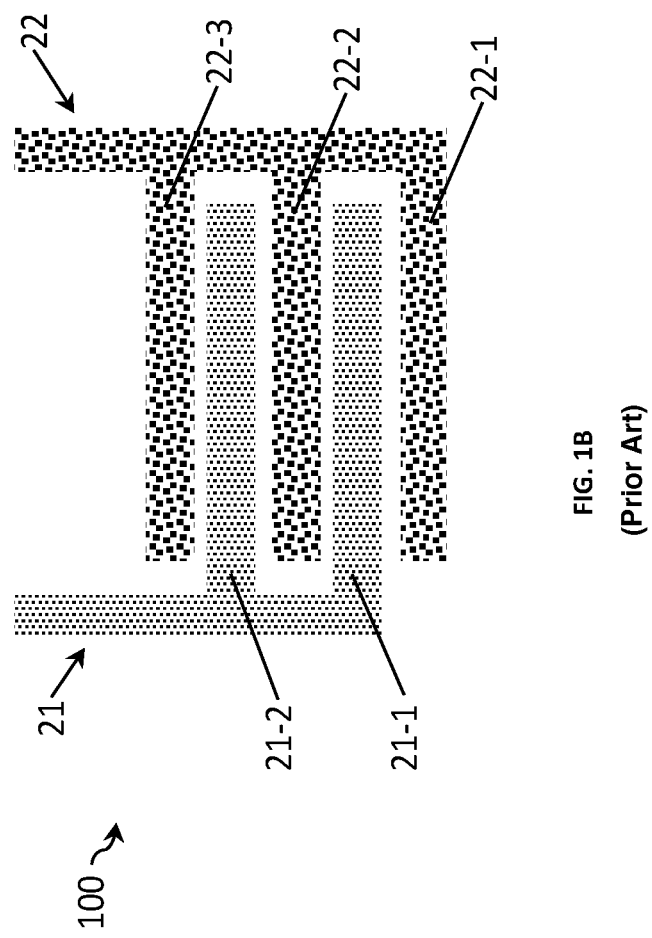

FIGS. 1A and 1B show two examples of a sensor 100 for measuring a conductivity of a liquid comprising a first electrode 21 and a second electrode 22 forming an interdigitated electrode array. In the example shown in FIG. 1A each electrode has two electrode fingers 21-1, 21-2 and 22-1, 22-2, while in the example shown in FIG. 1B, the first electrode 21 has two electrode fingers and the second electrode 22 has three. In both examples, the pairs of interdigitated electrode fingers are spaced relatively close to each other, for example at a distance d. The surface area of the electrodes is defined by its effective surface area which can be used for sensing, which in turn determines the cell constant of the sensor, Kcell.

Figure 2A:
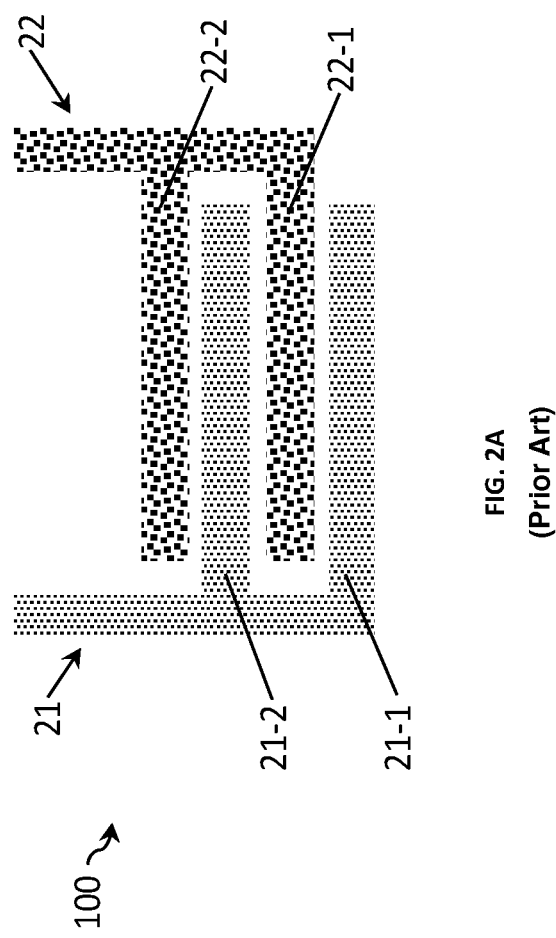
FIGS. 2A and 2B illustrate two other exemplary embodiments of a conventional conductivity sensor 100 with a pair of interdigitated planar electrodes.
Figure 2B:
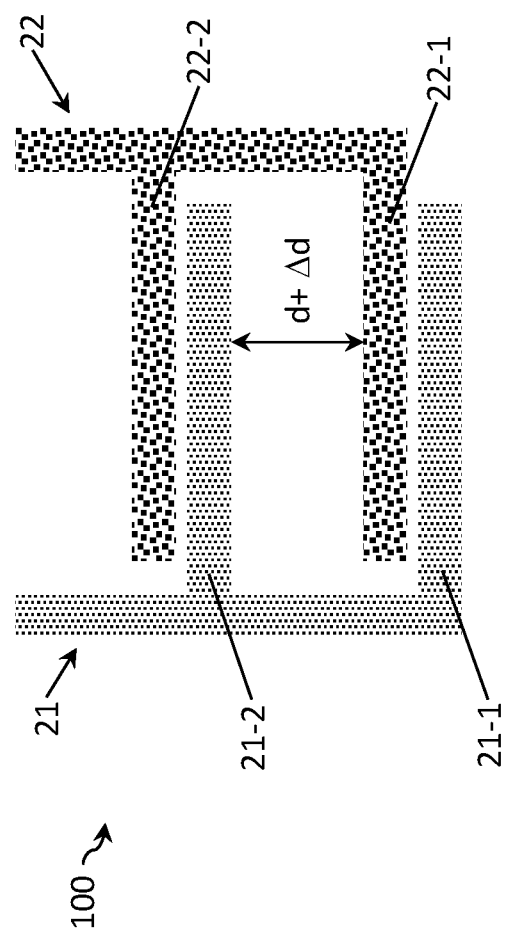

FIGS. 2A and 2B show two other examples of a sensor 100 for measuring a conductivity of a liquid with the similar sensor design as the sensors of FIGS. 1A and 1B except that the pairs of interdigitated electrode fingers are now spaced relatively far from each other, for example at a distance d+Δd. This sensor thus has a Kcell value bigger from the one of the sensor in FIGS. 1A and 1B. As detailed above, the bigger the distance between electrode fingers, the higher the Kcell value.

Figure 3A:
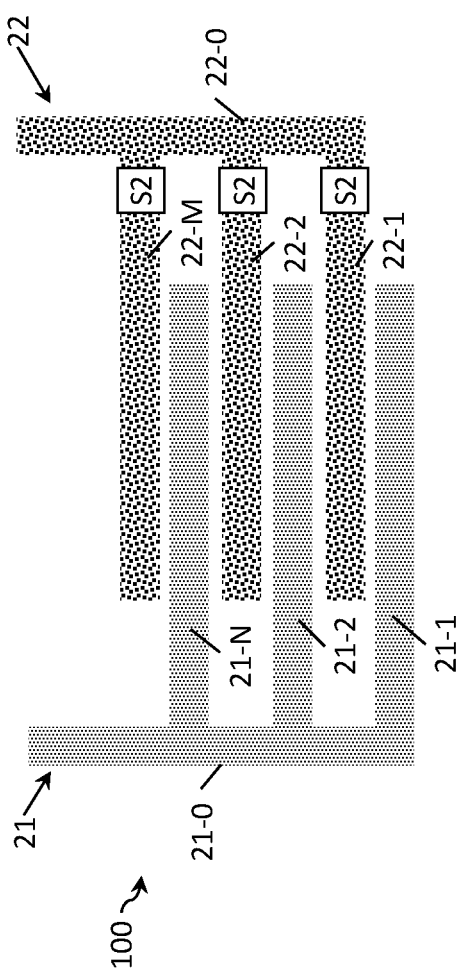
FIGS. 3A and 3B illustrate exemplary embodiments of a two-electrode conductivity sensor 100 according to the present disclosure.

FIG. 3A shows an example of a two-electrode sensor 100 for measuring a conductivity of a liquid according to the present disclosure. Similarly as above, the sensor comprises a first electrode 21 and a second electrode 22 forming an interdigitated electrode array. Each electrode has a plurality of electrode fingers 21-1 to 21-N and 22-1 to 22-M connected to an electrode terminal 21-0 and 22-0, respectively. In this example, the first electrode 21 has a fixed electrode design. The second electrode 22 is provided with switching means (e.g. a transistor) S2, arranged so that the electrode's surface area can be changed by connecting different numbers of fingers, for example connecting only one finger or a combination of fingers, to electrode terminal 22-0. Each of the electrode fingers connects in parallel to the remaining electrode fingers via the switching means. Switching one or more fingers to connect to the electrode terminal allows variation in the electrode's design, i.e. the effective number of electrode fingers and the distance between electrode fingers used for sensing. This in turns changes the cell constant (Kcell) of the sensor. The number of fingers provided with switching means depends on the conductivity range required. To provide a wider conductivity range it is sufficient that at least one of the fingers is provided with switching means, be it an outer or an inner electrode finger (i.e. electrode fingers placed closer or further away to the boundary of the sensing area, respectively). In the example shown in the figure, all electrode fingers 22-1 to 22-M connect to a common conducting terminal 22-0 via the switching means.

The electrode fingers and the terminals may be made of the gold (Au), platinum (Pt) or of any other inert and conducting material to avoid a chemical interaction with the solution to be measured. Such a chemical interaction may influence the measurement or change the active area and thereby the Kcell value of the sensor. However, any other inert conducting material may be used as electrode material, for instance Au, C, or Ti.

Alternatively, the terminal may be made of a different material, for example copper (Cu).

Figure 3B:
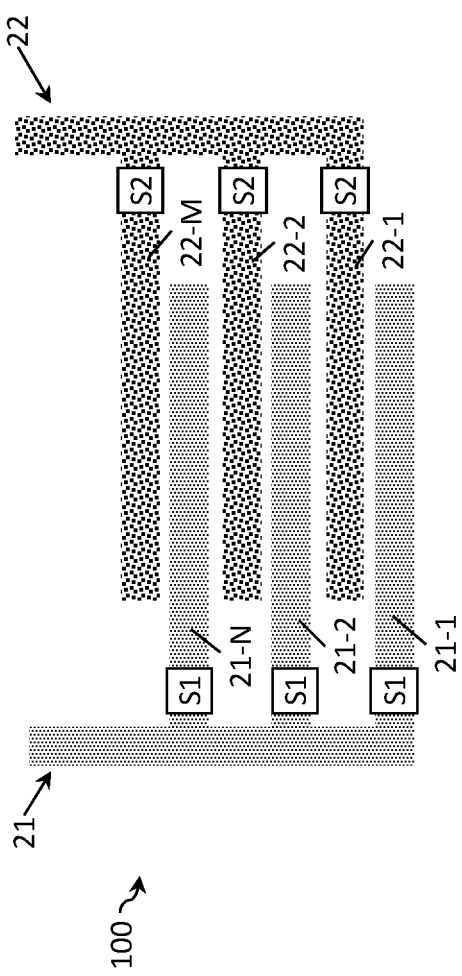

FIG. 3B shows another example of a two-electrode conductivity sensor 100 according to the present disclosure. The only difference with the sensor of FIG. 3A is that in this example the electrode fingers of both electrodes 21 and 22 are provided with switching means Si and S2, respectively. This allows for additional variability in electrode design. In this example, the resolution with which the Kcell may be varied is increased.

Figure 4A:
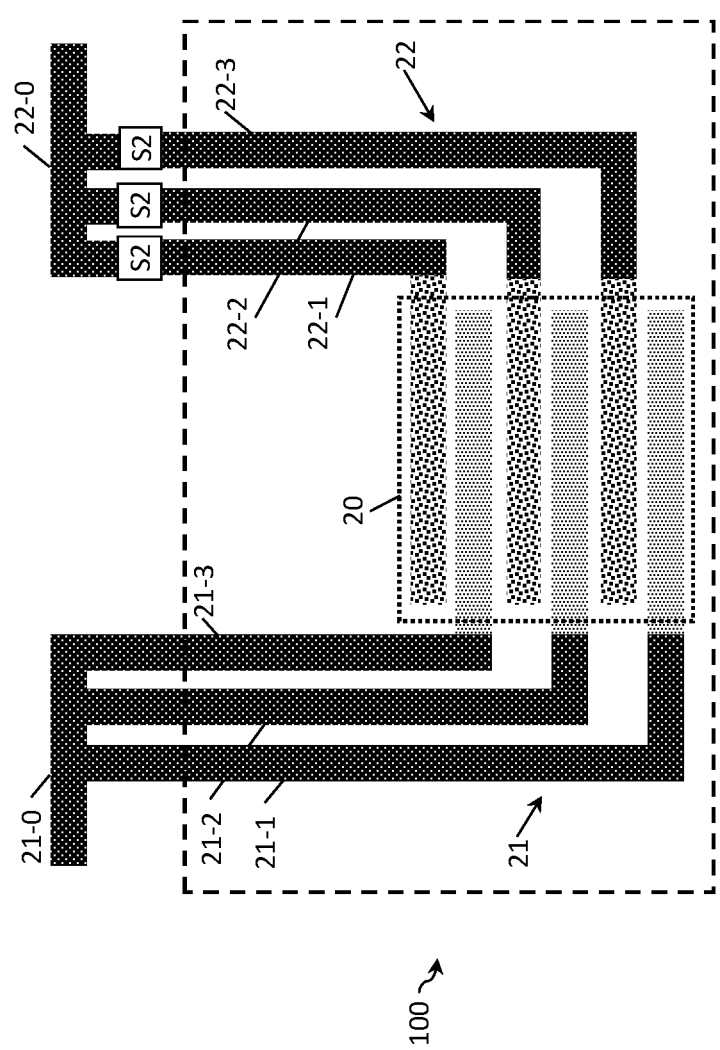
FIGS. 4A and 4B illustrate the conductivity sensors 100 of FIGS. 3A and 3B in further detail, according to an example embodiment.
Figure 4B:
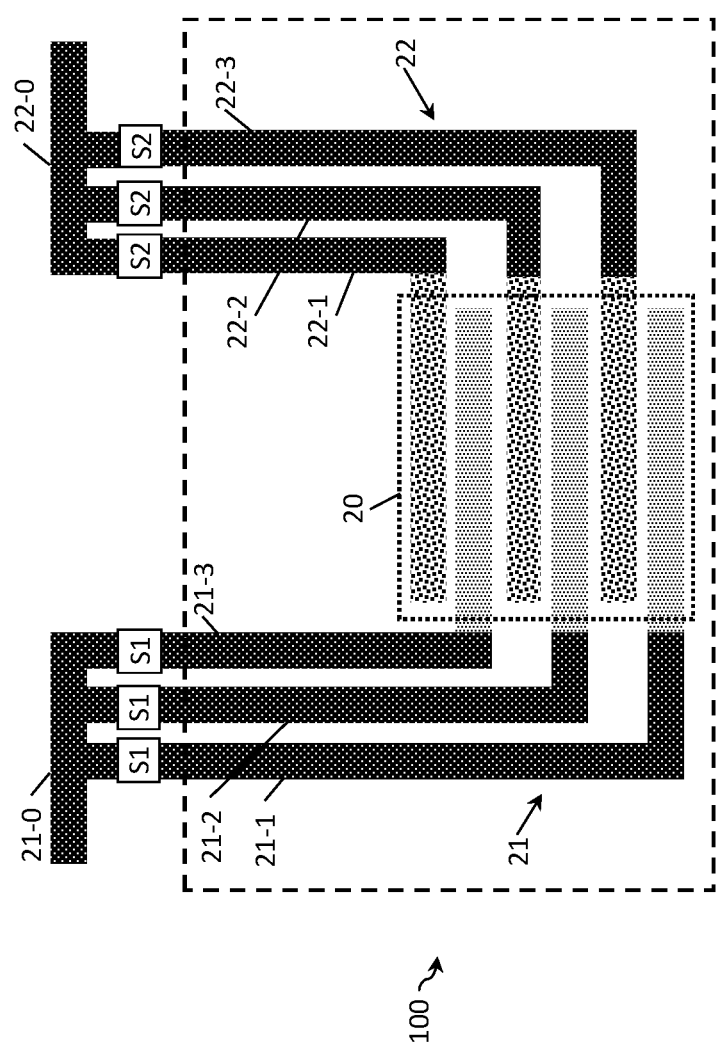

FIG. 4A and FIG. 4B show the examples of the two-electrode conductivity sensors 100 of FIG. 3A and FIG. 3B with the following differences. In this example, each electrode finger is connected to a respective conducting terminal and the conducting terminal is provided with switching means. The conducting lines (e.g., 22-1, 22-2, 22-3) for controlling the switches are external to the sensing area 20 of the sensor. This simplifies the manufacturing of the sensor as no conducting lines need to be routed within the sensing area 20. Another difference is that the electrode fingers and the terminals are made of different material. For example, the fingers are made of Au and the terminals of Cu.

Figure 5:
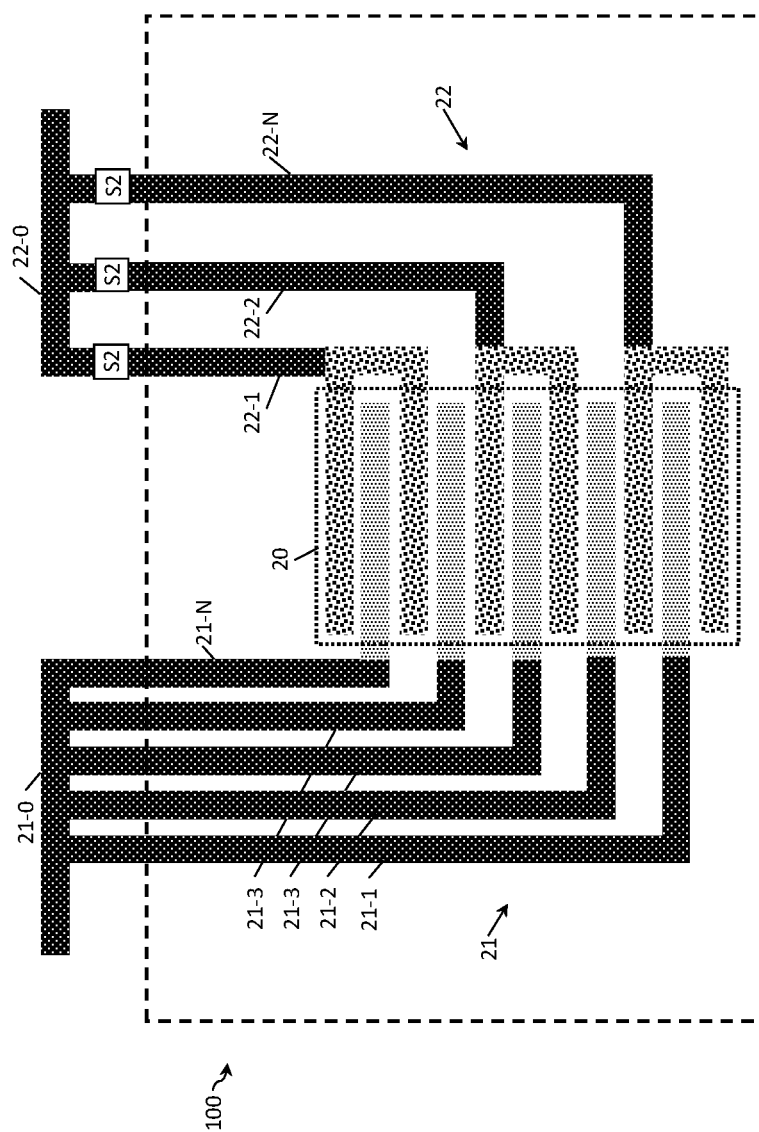
FIGS. 5 and 6 illustrate other exemplary embodiments of the two-electrode conductivity sensor 100 according to the present disclosure.
Figure 6:
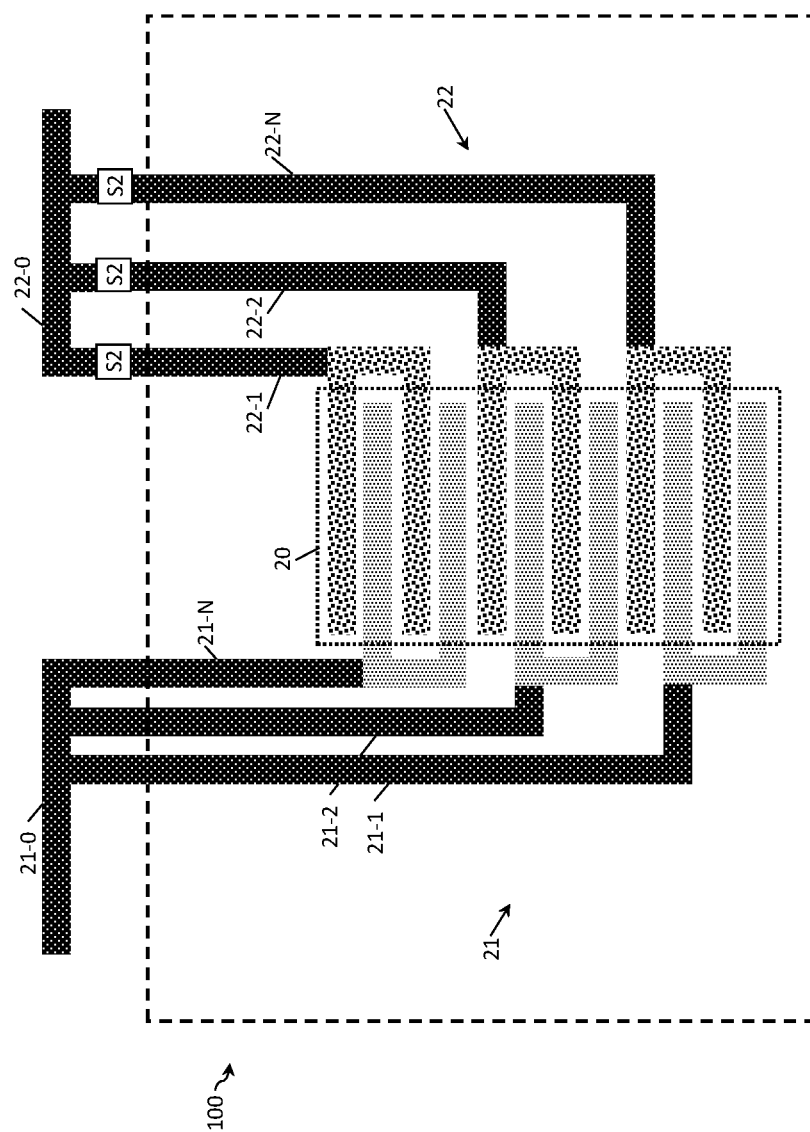

FIG. 5 and FIG. 6 show the two-electrode conductivity sensors 100 of FIG. 4A with a different electrode design. In FIG. 5, the second electrode 22 has a pair of electrode fingers connected to one conducting terminal, while FIG. 6 shows both electrodes 21 and 22 with the same design. FIGS. 5 and 6 show designs where the resolution with which the Kcell can be varied is smaller in comparison to FIGS. 4A and 4B. FIG. 6 shows a design with the additional advantage of maintaining a small sensor area 20 because of a decrease of connecting wires and number of switching means.

Figure 7A:
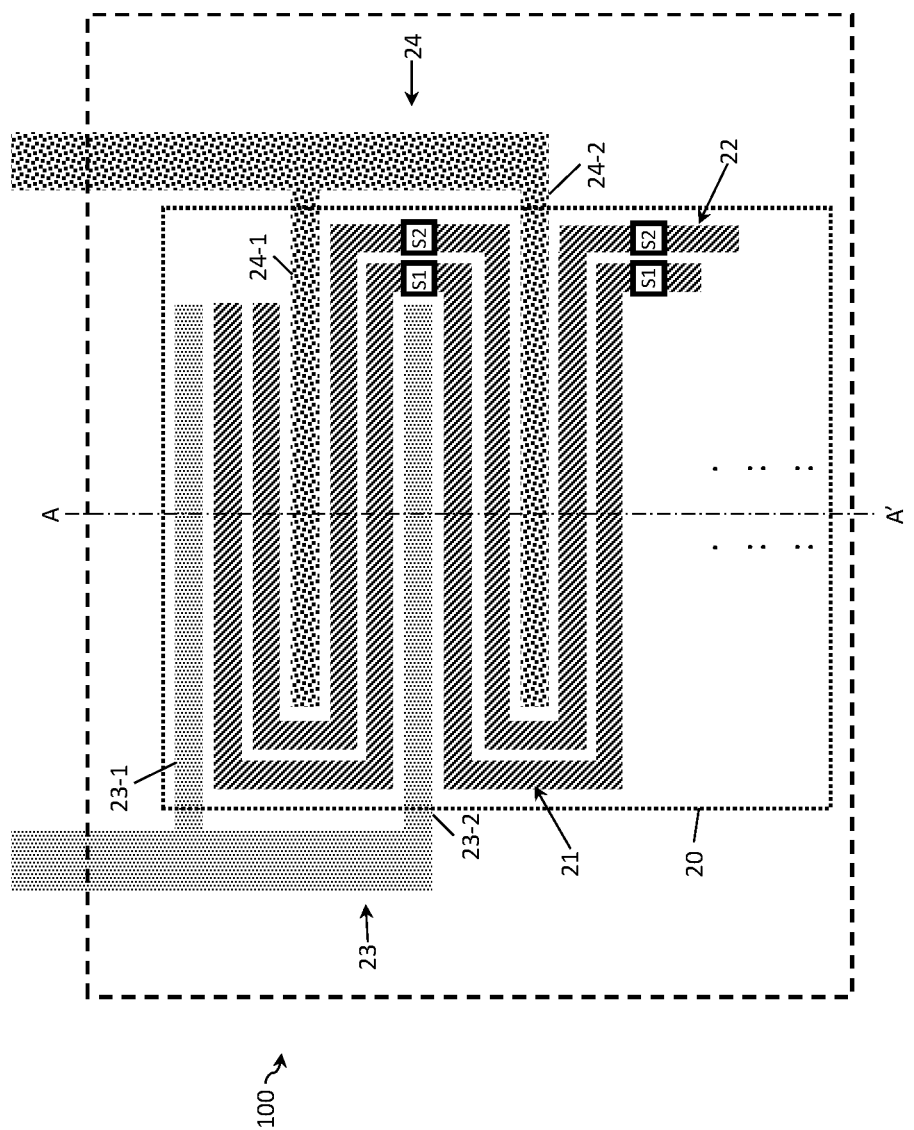
FIGS. 7A, 7B, and 7C illustrate exemplary embodiments of a four-electrode conductivity sensor 100 according to the present disclosure.
Figure 7B:
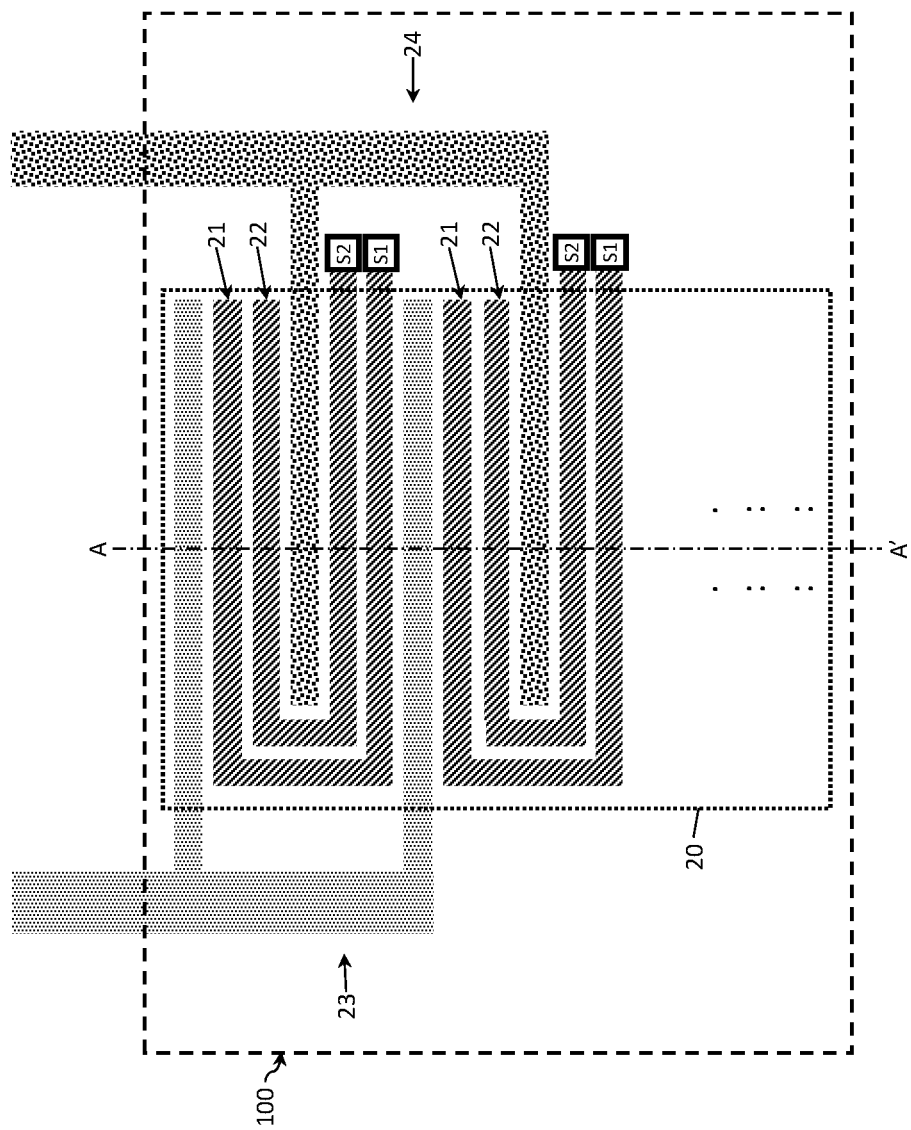
Figure 7C:
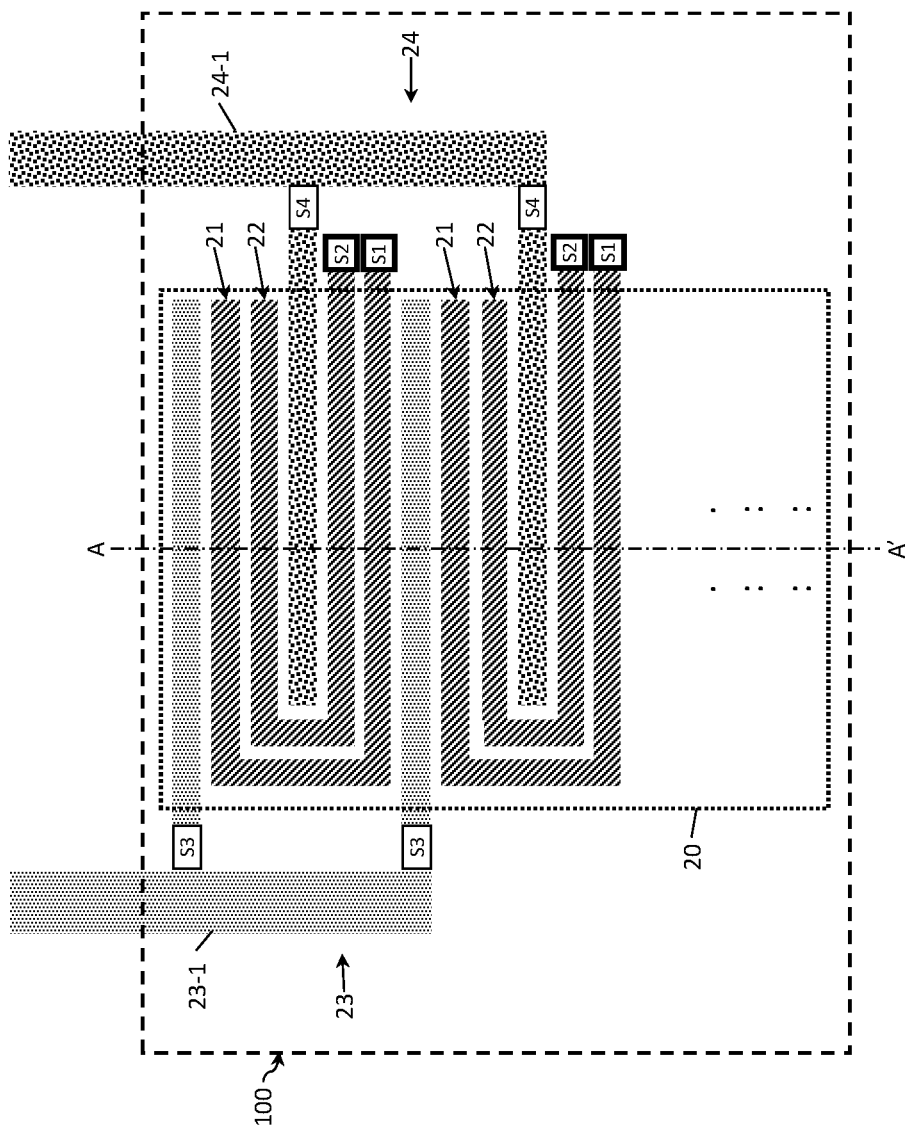

FIG. 7A to FIG. 7C show examples of a four-electrode conductivity sensor 100. FIG. 7A shows a conductivity sensor 100 with two outer and two inner electrodes. The first electrode 21 and the second electrode 22 are placed in a serpentine configuration in between the outer (i.e., the third and fourth) electrodes. In this arrangement, the outer electrodes form an interdigitated array and the inner electrodes a meandering array which advantageously decreases the sensor area 20, since the outer electrodes are placed around the inner electrodes. In comparison to a two-electrode design, the four-electrode design provides a wider Kcell measurement range at a single frequency. The inner electrodes have a plurality of electrode fingers 21-1 to 21-N and 22-1 to 22-M connected to electrode terminals 21-0 and 22-0, respectively (not shown). In this example, both inner electrodes are provided with switching means Si and S2. Differently from the two-electrode design, in the four-electrode design, the switching means connect the respective electrode fingers in series rather than in parallel with the same effect on the Kcell value of the sensor. Similarly to the two-electrode design the number of fingers provided with switching means depends on the conductivity range required.

In contrast to FIG. 7A, FIG. 7B shows a four electrode design in which respective electrode fingers of the inner electrodes are connected in parallel. Herein, similarly to the two-electrode design, the effective sensing area and thereby the Kcell value may be varied by changing the distance between electrode fingers in combination with increasing or decreasing the number of fingers. Advantageously, this electrode design allows for coping with sensor failures. For example, only a part of the electrodes (e.g. only the bottom half) can be used for measurements and, in the event of failure, the damaged bottom half is disconnected and replaced by the non-damaged part of the electrode (i.e. the top half) instead. The Kcell range herein can be varied by increasing or decreasing the effective length of the inner electrodes and thereby the effective sensing area.

FIG. 7C illustrates the four-electrode sensor as in FIG. 7B with the switching means S3 and S4 provided to switch the electrode fingers of the third and fourth electrodes 23 and 24. In addition to the above advantages, this design provides a more linear Kcell response.

Combinations of the sensor designs shown in FIGS. 7A-7C are also possible, thereby allowing electrode fingers to be grouped into sections which may comprise fewer or greater numbers of electrode fingers. In such a design, some of the switching means are arranged such that the sections may be connected together in parallel as in FIG. 7B, and the remaining are provided such that the electrode fingers within a respective section may be connected together in series as in FIG. 7A. Similarly to above, a damaged electrode section can be easily replaced with another electrode section.

The use of four-electrode sensor minimizes the influence of the electrode-electrolyte interface resistance on the measurement resistance. Another advantage of four-pole measurement systems is that there are no electrochemical reactions (electroplating, corrosion) happening on the measuring electrodes, since there is no current flowing through these electrodes. Electrochemical reactions could influence the effective area of the sensor and change the Kcell value. In the proposed the four-electrode conductivity sensor, the inner electrodes are folded around the outer electrodes. This has a positive effect in decreasing the sensor area, since the outer electrodes are used on both sides.

For the two-electrode sensor design, for a potentiostatic measurement, both first and second electrodes are used for current injection as well as for sensing. This means that a potential difference is placed on the same electrodes as the current is measured. For the four-electrode sensor design, for a galvanostatic measurement, the current is injected to the outer electrodes (i.e. the third and fourth electrodes) while the voltage is measured at the inner electrodes (i.e. the first and second electrodes).

The conductivity sensor may be provided with a readout circuit 210 arranged for applying potential to the electrodes and for controlling the switching means via conducting lines. The readout circuit is connected to the bondpads of the sensor (not shown) via connection lines. The connecting lines may be made of copper (Cu) or any other conducting material.

In some embodiments, the switching means S1, S2, S3, and S4 may be provided in the readout circuit instead. In this case, no conducting lines need to be routed within the sensing area and the need for water protection over the electrodes is eliminated, resulting in low manufacturing costs. In addition, in case of a sensor failure, only the sensor electrodes need to be replaced without the need for replacing the readout circuit and/or the switching means. This leads to easier and cheaper maintenance.

In some embodiments of any of the disclosed aspects, the sensor is miniaturized and the electrodes are deposited on an insulating substrate. The substrate may be, for example, a silicon (Si), glass, or plastic substrate.

Figure 8:
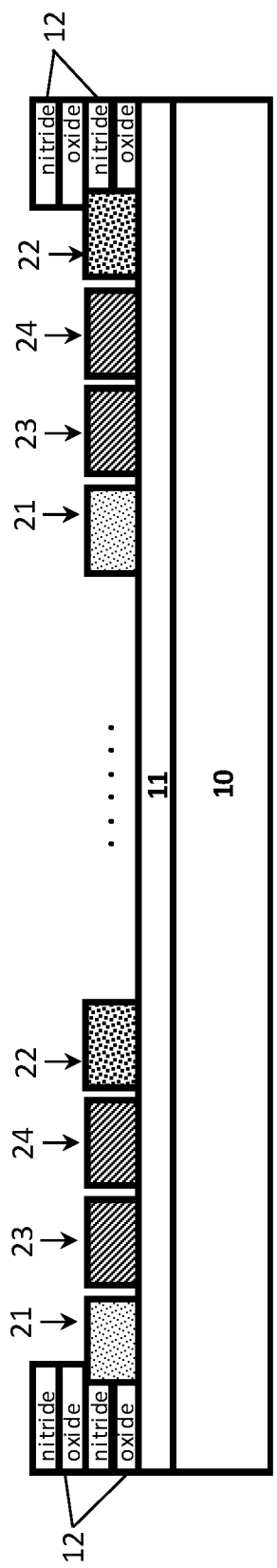
FIG. 8 illustrates a cross section view of the four-electrode conductivity sensor according to an exemplary embodiment of the present disclosure.

In another aspect, the present disclosure relates to a manufacturing method. The method will be explained with reference to the four-electrode sensor design of FIGS. 7A-7C but in the embodiment where the switching means are provided in the readout circuit. FIG. 8 shows a schematic drawing of a cross-section of the four-electrode conductivity sensor along the A-A' axis.

The conductivity sensor may be manufactured on a silicon (Si) substrate 10. Because the silicon is a conductor, as a first step, an isolation layer 11 of thermal oxide is grown. The electrode layer, existing of 10 nm Tantalum (Ta) (adhesion layer) and 200 nm Platinum (Pt) is then deposited by sputtering. For example, a Physical Vapour Deposition (PVD) may be used for this step. Afterwards, electrodes 21 to 24 are formed by patterning using conventional lithography in combination with Ion-Beam-Etching which is a physical dry etch process. The connecting wires from the bondpads towards the sensor may be also made of Pt in the same step as the electrodes and thus take part in the conductivity measurement. To overcome this, an isolation stack 12 of Oxide, Nitride, Oxide, and Nitride is deposited by a Plasma-Enhanced Chemical Vapor Deposition (PECVD) process. This stack is then opened where the sensor and bondpads have to be formed by using contact lithography and Reactive Ion Etching (ME).

Platinum (Pt) material is used as electrode material because it is an inert material to avoid a chemical interaction with the measurement solution. Such a chemical interaction may influence the measurement or change the active area and thereby the Kcell value. However, any other inert conducting material may be used as electrode material, for instance Au, C, and Ti.

The isolation stack 12 is made of Oxide, Nitride, Oxide, and Nitride but it can be made by any other inorganic or a polymeric isolation layer that avoids a contact between connection leads and the measurement solution, such as, for example, SU-8TM (epoxy resist).

Moreover, the silicon substrate 10 with an oxide isolation 11 placed on top of it can also be replaced by any other isolating substrate like glass or plastic.

A dicing step is performed to separate the different sensors on the wafer. After dicing, each sensor is mounted on a printed circuit board (PCB). The electrical connection to the PCB is made using conventional wire bond techniques. The bondpads and wire bonds are covered with glob-top to electrically isolate them from the measurement solution.

In another aspect, the present disclosure relates to a measuring system 200 which comprises one or more conductivity sensors 101-104 as described above.

Figure 9:
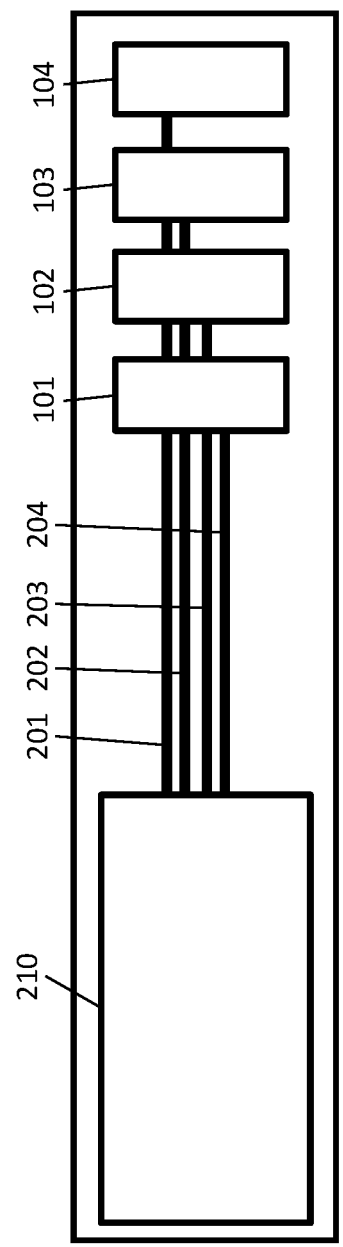
FIG. 9 illustrates a conductivity sensor according to other exemplary embodiments of the present disclosure.

FIG. 9 shows an example of a measuring system with four conductivity sensors 101-104 and a readout circuit 210 with integrated switching means. Each of the sensors may have a different sensor design that allows for broadening the range and/or increasing the precision of the measurements. Thus, each conductivity sensor can sense conductivity of a liquid within a different conductivity range and/or with a different precision. The sensors are connected to the readout circuit 210 via conducting lines 201-204, respectively, through which potential is applied to the outer electrodes 23 and 24 and measurement is effected on the inner electrodes 21 and 22.

To provide processing and/or radio functionalities, the conductivity sensor and/or the measuring system may be integrated with a PCB circuit, a CMOS, or a MEMS chip. This allows for remote control of the sensor or the measuring system. For example, the frequency at which measurements are effected (i.e., the period between measurements) may be modified when needed. In addition, measurement data may be deployed to an external device such as a central control/processing unit. In such a system, the overall Kcell value is determined by the number of sensors used during the measurements. By using more sensors the total effective area is increased and the Kcell value decreased. Thereby the microsystem allows for measuring a range of conductivity similar to systems employing macro-electrodes.

In another aspect, the present disclosure relates to a sensor network which comprises one or more conductivity sensors as described above and/or one or more measuring systems depending on the required specifications. For example, a number of conductivity sensors may be distributed to different fluid solutions under test. The sensor and/or the measurement circuits are further arranged to provide the measurements to a central readout circuit. The analysis of the measurements can be done partially or fully by the central readout circuit. In the first case, the readout circuit of a respective sensor may send pre-processed measurements to the central readout circuit which will do a further analysis of the measurements received by all sensors in the network.

The conductivity sensor according to the present disclosure offers a variable Kcell, thereby allowing the proposed sensor to be used with a wide range of solution concentrations. Advantageously, the effective sensor area for a four electrode system is decreased by folding the inner electrodes in between the outer electrodes, as long as the current direction is not switching over the inner electrodes. This can be accomplished, for instance, by configuring the outer electrodes in the shape of interdigitated fingers, with the inner electrodes in a serpentine configuration and parallel on each other, in between the outer electrodes, as shown in FIGS. 7A-7C.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A sensor for measuring a conductivity of a liquid comprising:
   a first electrode having a first surface area;
   a second electrode having a second surface area, wherein the first surface area and the second surface area contribute to an overall surface area of the sensor that is associated with corresponding cell constant of the sensor; and
   a switch circuit configured to couple at least one of the first electrode and the second electrode to a circuit to adjust the overall surface area and the corresponding cell constant of the sensor, wherein the switch circuit is configured to be closed to facilitate measurement of a first liquid expected to have a conductivity falling within a first conductivity range, and to be opened to facilitate measurement of a second liquid expected to have a conductivity falling within a second conductivity.

2. The sensor of claim 1, wherein the switch circuit is coupled to the first electrode, wherein the sensor further comprises a second switch circuit coupled to the second electrode to facilitate further adjustment of the overall surface area and the corresponding cell constant of the sensor.

3. The sensor of claim 1, wherein the first electrode and the second electrode form an interdigitated array of electrodes.

4. The sensor of claim 3, wherein the first electrode and the second electrode comprise a plurality of electrode fingers and wherein the switch circuit is coupled to least one electrode finger of the at least one electrode so that the at least one electrode finger is switchably connectable in parallel to remaining electrode fingers of the at least one electrode.

5. The sensor of claim 1, wherein the first electrode and the second electrode form a meandering array of electrodes.

6. The sensor of claim 5, wherein the first electrode and the second electrode comprise a plurality of electrode fingers and wherein the switch circuit is coupled to least one electrode finger of the at least electrode so that the at least one electrode finger is switchably connectable in series to remaining electrode fingers of the at least one electrode.

7. The sensor of claim 5, the sensor further comprising a third electrode and a fourth electrode, each comprising one or more electrode fingers and arranged so that the third electrode and the fourth electrode form an interdigitated array of electrodes wherein the first and second electrodes are arranged to meander in between the electrode fingers of the third and fourth electrodes.

8. The sensor of claim 7, wherein the third and fourth electrodes are used for current injection and wherein at least one of the electrode fingers of either or both the third and fourth electrodes are provided with a switch circuits.

9. The sensor of claim 1, wherein the circuit corresponds to readout circuit that is configured to apply a potential to the first electrode and the second electrode and to facilitate control of the switch circuit.

10. The sensor of claim 9, wherein the readout circuit comprises the switch circuit.

11. The sensor of claim 1, wherein the switch circuit comprise a transistor.

12. The sensor of claim 1, wherein the sensor is miniaturized and the electrodes are deposited on an insulating substrate.

13. A measuring system comprising a sensor for measuring a conductivity of a liquid of claim 1.

14. The measuring system of claim 13, comprising a plurality of sensors for measuring a conductivity of a liquid of claim 1, wherein at least one sensor of the plurality of sensors has a different sensor design.

15. A sensor network comprising the sensor of claim 1.

16. A measuring system comprising the sensor of claim 1.

* * * * *